United States Patent [19]
Adishian

[11] Patent Number: 5,291,063
[45] Date of Patent: Mar. 1, 1994

[54] HIGH-POWER RF DEVICE WITH HEAT SPREADER BUSHING

[75] Inventor: Gary C. Adishian, Scottsville, N.Y.

[73] Assignee: ENI Div. of Astec America, Inc., Rochester, N.Y.

[21] Appl. No.: 812,694

[22] Filed: Dec. 23, 1991

[51] Int. Cl.$^5$ .................. H01L 23/02; H01L 23/12
[52] U.S. Cl. .................................. 257/712; 257/718; 257/732; 165/80.3; 165/104.33; 174/52.5; 361/707; 361/714; 361/760
[58] Field of Search ............... 257/712, 713, 731, 732, 257/733, 718; 174/52.1, 52.5; 165/80.3, 104.33; 361/381, 388, 389, 400, 403

[56] References Cited

U.S. PATENT DOCUMENTS

| | | | |
|---|---|---|---|
| 4,517,585 | 5/1985 | Ridout et al. | 257/732 |
| 4,990,987 | 2/1991 | Boucher et al. | 257/718 |

Primary Examiner—Rolf Hille
Assistant Examiner—David Ostrowski
Attorney, Agent, or Firm—Harris Beach & Wilcox

[57] ABSTRACT

A high-power RF feedback resistor assembly includes a flat film resistor or other flat device mounted in thermal communication onto a bushing which is, in turn, mounted directly onto a cooling flange of an associated power transistor. A bushing has a vertical bolt hole through it to receive a threaded screw. The bushing can have a cutout beneath the flat vertical surface on which the resistor is mounted to provide clearance for a printed circuit board.

9 Claims, 3 Drawing Sheets

HIGH-POWER RF DEVICE WITH HEAT SPREADER BUSHING

BACKGROUND OF THE INVENTION:

This invention relates to high power electronic components, such as resistors, and is more particularly concerned with an assembly comprising the component and a bushing on which it is mounted that couples the component thermally to a conducting surface, such as a transistor flange mounted onto a heat sink.

In RF power systems, such as transistorized amplifiers and RF frequency generators, it is often required to dissipate large amounts of power through a feedback resistor, resistive termination, or other suitable device.

At the present time, many high powered radio frequency amplifiers employ high power feed back resistors associated with their power transistors. These are of two basic types, Parallel and Series Feedback resistors. Parallel Feedback resistors are typically 25 to 100 ohms in value and dissipate power up to 25–50 watts. Consequently, reliability considerations require power dissipation ratings up to 100 watts or more. Series Feedback resistors are typically 0.5 to 5 ohms in value and require similar high power dissipation levels and associated high power ratings. Ceramic resistors are often employed for this purpose. Ceramic resistors rely on convective air cooling. These resistors are typically very large, and even then the largest are only rated at about ten watts. Thus, the ceramic power resistors can be over driven, and in operation can become quite hot, often red-hot. At elevated temperatures, the resistive value changes, which, in turn, changes the gain characteristic and the impedance of the amplifier. This, in turn, can destabilize the amplifier, resulting in RF instability and spurious output and even catastrophic destruction of the transistor.

It has been proposed to employ flanged or "half-flange" resistors of the type in which a flat film resistor or other device is formed on a flat metal plate, with one end of the plate serving as both a carrier for the resistor or other device and a heat spreader type mounting base. This type of device can be configured similar to a TO-220 device. In this configuration the flat metal flange is in the same plane as the flat resistive or other type of circuit element, and the flange lies secured to the chassis or other suitable heat sink through a hole in the flange. The problem for devices of this configuration is that they are both geometrically incorrect and physically too large for mounting on a transistor's cooling flange. Thus, if half-flange or "full" flange resistors are employed, it is necessary to redesign and reconfigure the circuit board or chassis to accommodate them. This can involve completely revising the circuit architecture, which is already quite dense and very compact and may even be prohibited altogether by size constraints.

OBJECTS AND SUMMARY OF THE INVENTION

Accordingly, it is an object of this invention to provide improved conductive type heat sinking for the power resistor or other device, such as an RF power feed back resistor for an RF power amplifier.

It is another object to provide an RF power resistor or other power device that is compact and can be employed without need to rearrange the associated circuit elements, thereby simplifying retrofit.

It is still another object to provide an RF power DC bias diode type device with a short and direct thermal path to a flange of a high power RF transistor, thus improving thermal tracking in the function of temperature compensation of the bias voltage of the transistor.

It is a further object of this invention to make the device compact so as to avoid creating stray radiation and, if possible, to reduce the amount of stray radiation.

It is a still further object of this invention, as applied to the feedback resistor device, to employ the power thick-film structural concept to minimize undesirable parasitic inductive and compacitive reactances. This is of paramount importance as the "pure" resistance is necessary to avoid RF instabilities involving parametric spurious oscillations resulting from phase shifts caused by uncontrolled parasitic reactances in the feedback circuits.

In accordance with one aspect of this invention, a highpower RF device, such as a power resistor, can be favorably employed in a compact but high power circuit, e.g. as a feedback resistor for a transistor in an RF amplifier circuit. The amplifier employs one or more transistors with each having an intregal flange-type mounting base intended for induction cooling via an attached heat sink. The flange of the transistor is fastened by two threaded screws onto a heat sink plate which draws off waste heat from the transistor. The proposed RF device includes a vertically-elongated bushing formed from a high-thermal conductivity metal, such as copper or brass, which is plated, and which has a vertical bolt-hole through it which receives the same, but lengthened threaded screw that holds down the one end of the transistor flange. A flat lower mounting surface of the bushing mates with the upper surface of the transistor flange. A flat high-power electrical element, such as a power feedback resistor, is affixed onto a flat vertical plated surface of the bushing via a high temperature soldering process or an equivalent bonded process. This mechanical bond provides thermal conduction with the device, so that waste heat generated by the high power electrical element during operation passes into the bushing, and through the bushing, from which it is conducted out through the transistor flange into the heat sink plate. In a preferred embodiment, the bushing has vertical chamfers on the side away from the flat vertical surface. The bushing can also have a cutout disposed beneath its flat vertical surface extending to the lower horizontal surface to provide a clearance for the bushing to penetrate a circuit board in which the transistor flange is mounted in a profiled opening.

In a preferred mode, the RF power device is an RF film resistor that serves, for example, as the feedback resistor of a power amplifier. In other possible embodiments, the device can be a single or a dual RF termination resistor or a power diode DC bias device such as a dual array biased diode device. As a power diode bias device or as a dual array bias diode device, the bushing provides an adequate amount of the thermal conduction of heat generated in the transistor to the diode(s). The bushing, therefore, provides a thermal sensor function. This results in a temperature-induced change in the diode voltage(s). This facilitates temperature compensation of the transistor's bias voltage with sufficient accuracy and speed of response to stabilize its quiescent DC current. The function described would apply to a high power flanged RF transistor of the bipolar junction type, operating in Class A or Class AB. The dual array bias device embodiment would apply to the application of two separate DC bias voltages to two individual transistors configured either as separate devices or as a dual transistor array contained in a single package.

The above and many other objects, features and advantages of this invention will be understood from the ensuing detaile description of a preferred embodiment, which should be read in connection with the accompanying Drawing.

DETAILED DESCRIPTION OF THE PREFERRED EMBODIMENT

Figure 2:
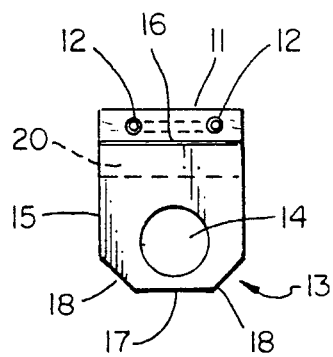
FIGS. 2 and 3 are a top plan view and a rear elevational view, respectively, of the device of FIG. 1.
Figure 1:
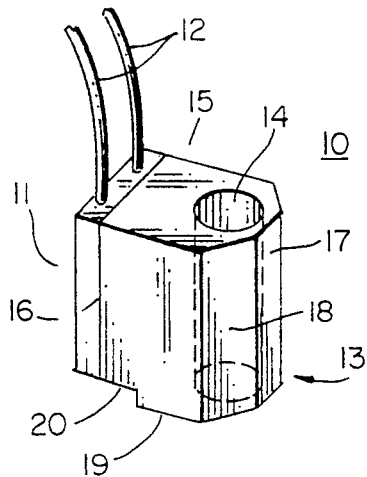
FIG. 1 is a perspective view of a high-power RF device according to one preferred embodiment of this invention.
Figure 3:
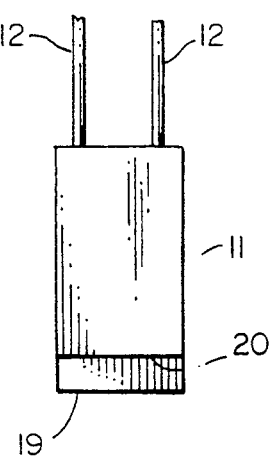

With reference to the Drawing, and initially to FIGS. 1-3, a power resistor assembly 10 is formed of a flat film resistor 11 having electrodes or leads 12, and attached onto a metal bushing 13. The resistor is formed in well known fashion as a sandwich of a resistive film between ceramic covers. The bushing is formed of a good thermal conductor, such as copper, brass, or aluminum. Preferably the materials should be a metal that wets with solder to facilitate attachment of the resistor 11, and, in some cases, to facilitate grounding thereof. The bushing 13 is vertically elongated, and has a vertical bolt hole 14 through it extending from a top horizontal surface 15. On a flat vertical back surface 16 of the bushing, the flat film resistor 11 is affixed. Opposite the back surface is a vertical front side 17, having vertical chamfers 18,18 extending along each side thereof. A flat lower horizontal surface 19 mates with the cooling flange of an RF power transistor as described below. A step or recess 20 is formed adjacent to the lower surface 19 and beneath the vertical flat surface 16. This structure helps accommodate the thickness of a printed circuit board through which the transistor is mounted, as also described below.

Figure 4:
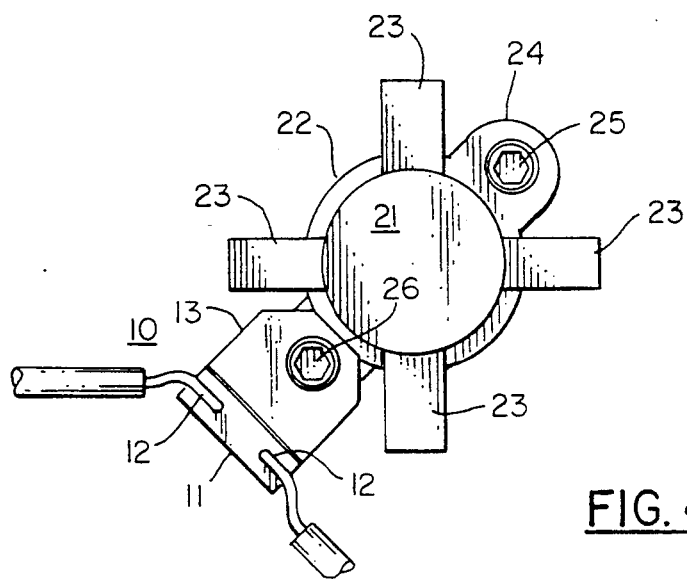
FIG. 4 is a top plan view showing the device installed on a heat sink flange of an RF power transistor.
Figure 5:
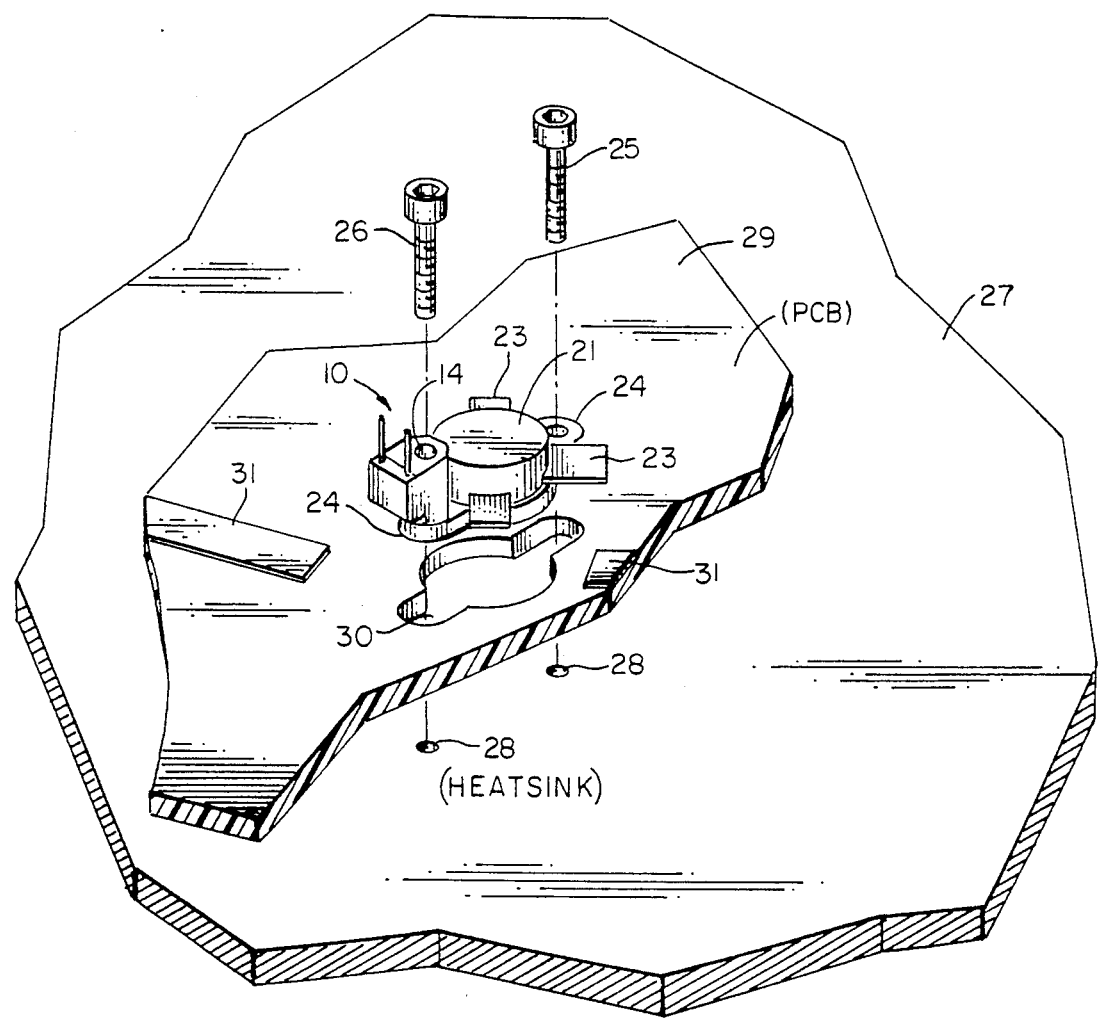
FIG. 5 is an assembly view of the device and transistor in respect to a printed circuit board and heat sink plate.

FIGS. 4 and 5 show the power resistor assembly 10 mounted onto an RF power transistor 21. This transistor has a flanged case 22 with flat electrodes 23 extending from the case, and with ears or cooling flanges 24 that conduct waste heat from the transistor 21 to a heat sink. The transistor is fastened by means of threaded screws 25 and 26 which hold the ears of the flange 24 down against a heat sink plate 27, and are received in threaded bores 28 in the plate 27. The heat sink plate can be liquid-cooled or air-cooled, as desired.

A printed circuit board 29 is employed, and the transistor 21 is favorably mounted through a profiled cutout 30 in the board onto the heat sink plate 27 beneath. The cutout 30 is shaped so that the base of the heat sink flanges 24 are on the level of the plate 27, while the flat electrodes 23 are on a level with the printed circuit pathway 31 on the upper surface of the board 29. The cutout 20 on the bushing 13 permits the flat resistor 11 to be mounted above the board 29 while the bushing lower face 19 is in good thermal contact with the associated flange 24 of the transistor. This means that the resistor assembly 10 can be retrofitted onto an existing circuit without having to alter the circuit board 29 or to change the location of any of the other components. The only accommodation required is that the screw 26 should have a slightly longer shaft than the other screw 25.

Figure 6:
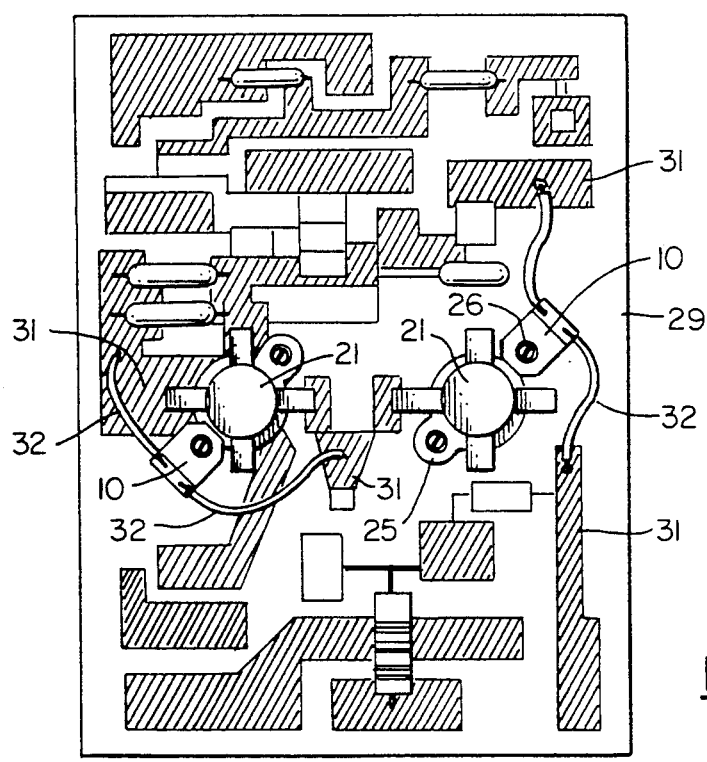
FIG. 6 is a plan view of a printed circuit that incorporates power transistors with RF power feedback resistors according to the embodiment of FIG. 1.

FIG. 6 shows a typical RF transistor amplifier layout wherein there are two transistors 21, 21 associated with the printed circuit board 29. Each of these transistors has an associated RF power resistor assembly 10, 10, here connected as feed back resistors. In this case, each of the transistors 21 has one remaining unused flange on which an additional power device could be installed, if desired, which would similarly include a heat spreader bushing of the type previously described. The printed circuit board includes a printed circuit conductor pathway 31 to which the transistor electrodes 23 are soldered, and wire conductors 32 which are soldered to the leads 12, 12 and to pads of the circuit conductor path 31.

Figure 7:
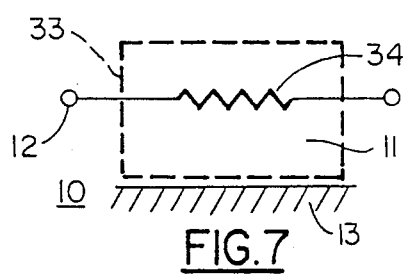
FIG. 7 is a schematic view of the RF power feedback resistor device of FIG. 1.

As shown in FIG. 7, the feedback resistor 11 has a casing or housing 33 which is mounted in thermal contact with the bushing 13. A film resistive element 34 has its ends respectively connected to the two electrodes or leads 12.

Figure 8:
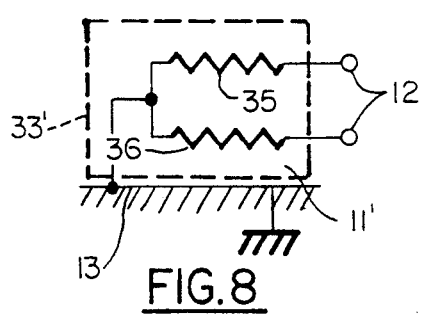

In an alternative arrangement shown in FIG. 8 a dual resistive termination can include first and second resistors 35, 36 disposed within the casing 33', wherein each of the resistors has one end coupled to its respective terminal 12, and its opposite end coupled to the other resistor and through the bushing 13 to ground. The resistors 35 and 36 can have the same value or different values, depending on the circuit application.

Figure 9:
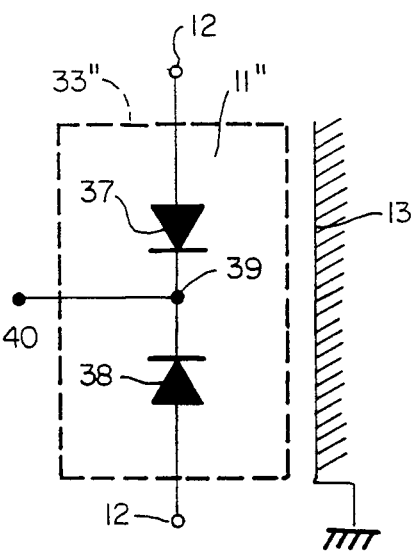
FIGS. 8 and 9 are schematic electrical views of alternative devices that incorporate the principles of this invention.

FIG. 9 shows another electrical device, here a dual array bias device 11''. Within the flat case 33'' are first and second power diodes 37, 38. These are connected in series, with the anode of the diode 37 being coupled to one of the leads 12, and the anode of the other diode 38 being coupled to the other lead 12. At a center junction 39 the cathodes are connected to a common terminal 40. A similar device having only one diode, or having the diodes not being connected at their junction to the bushing, could be constructed. In the case of the device of FIG. 9, the diodes 37 and 38 are in intimate thermal contact with the cooling flange of the RF transistor 21. This results in optimal thermal tracking of the transistor 21. Thus, the configuration of FIG. 9 is especially useful for single-ended class A or class AB mode BJT transistor power amplifiers.

Moreover, with the construction of the device as described hereinabove, the size of the elements is kept quite small, so that there is intimate thermal contact of the resistor or other device with the bushing. This permits retrofitting onto its existing circuit boards. Also, because of the small size and the small dimensions involved, stray radiation is minimized. Additionally, the proximity of the bushing to the device does actually ground some of the stray radiation. High power operation, such as 50 watts or more, is possible without overdriving the element, that is, without stressing or heating the resistor or other device to the point at which its value is significantly changed. While not shown here, it is possible to attach cooling fins to the bushing, or onto the ceramic case of the resistor.

Terms of orientation, such as "horizontal" and "vertical", both as used in this description and in the ensuing claims, are meant to facilitate understanding of the invention with reference to the drawing figures. It should be understood, however, that the device in question invention is not limited to any arbitrary orientation, as the need not be disposed in any specific orientation.

While this invention has been described in detail with respect to a selected preferred embodiment, it should be understood that the invention is not limited to that precise embodiment. Rather, many modifications and variations would present themselves to those of skill in the art without departing from scope and spirit of this invention, as defined in the appended claims.

What is claimed is:

1. High-power RF device for mounting onto a horizontal heat-conducting flange of a high-power RF transistor which flange is fastened by a threaded screw onto a heat sink plate to draw off waste heat from the transistor, comprising a vertically elongated bushing formed of a metal having high thermal conductivity and having a vertical bolt hole therethrough to receive said threaded screw, a flat horizontal lower surface that mates with an upper surface of said transistor flange, and a flat vertical surface; and a flat power electrical element affixed onto the vertical surface of said bushing and bonded in thermal communication therewith so that waste heat generated by said power electrical element in operation passes into said bushing and thence is conducted through said transistor flange into said heat sink plate.

2. High-power RF device according to claim 1 wherein said bushing has vertical chamfers on a vertical side away from the flat vertical surface on which the electrical element is affixed.

3. High-power RF device according to claim 1 wherein said bushing has a cutout beneath said flat vertical surface and extending to said lower horizontal surface to provide a clearance for the bushing to penetrate a circuit board through which said transistor flange is mounted.

4. High-power RF device according to claim 1 wherein said element has electrodes that extend outwards and has a ceramic flat casing which is affixed onto said vertical surface of said housing.

5. High-power RF device according to claim 4 wherein said element is an RF film resistor serving as a feedback resistor of a power amplifier that also employs said RF transistor.

6. High-power RF device according to claim 4 wherein said element is a single termination-type resistor formed by a single resistor which has one end grounded to said bushing.

7. High-power RF device according to claim 4 wherein said element is a dual termination resistor formed of a pair of resistances each of which has one end grounded to said bushing.

8. High-power RF device according to claim 4 wherein said element includes a power diode device.

9. High-power RF device according to claim 7 wherein said power diode device is a dual array bias device formed of a pair of diodes with a junction therebetween providing a common terminal.

* * * * *